US012604534B2

(12) United States Patent
Asao et al.

(10) Patent No.: US 12,604,534 B2
(45) Date of Patent: Apr. 14, 2026

(54) PROTECTION CIRCUIT AND SEMICONDUCTOR INTEGRATED CIRCUIT DEVICE

(71) Applicant: ALPS ALPINE CO., LTD., Tokyo (JP)

(72) Inventors: Akira Asao, Miyagi (JP); Kiyoshi Sasai, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 409 days.

(21) Appl. No.: 18/356,661

(22) Filed: Jul. 21, 2023

(65) Prior Publication Data

US 2023/0361109 A1     Nov. 9, 2023

Related U.S. Application Data

(63) Continuation of application No. PCT/JP2021/043945, filed on Nov. 30, 2021.

(30) Foreign Application Priority Data

Feb. 3, 2021    (JP) .................................. 2021-016136

(51) Int. Cl.
*H10D 89/60*         (2025.01)
*H10D 84/80*         (2025.01)

(52) U.S. Cl.
CPC ......... H10D 89/813 (2025.01); H10D 84/811 (2025.01); H10D 89/911 (2025.01)

(58) Field of Classification Search
CPC .. H10D 89/813; H10D 89/911; H10D 84/811; H03K 17/10; H03K 19/003
See application file for complete search history.

(56) References Cited

U.S. PATENT DOCUMENTS

2007/0216453 A1* 9/2007 Vispute ................ H03K 17/223
                                                              327/143
2014/0002936 A1* 1/2014 Sawataishi ............. H02H 3/003
                                                              361/56
2015/0256166 A1   9/2015 Saito et al.

FOREIGN PATENT DOCUMENTS

JP       2014-011233       1/2014
JP       2015-170956       9/2015

OTHER PUBLICATIONS

International Search Report for PCT/JP2021/043945 mailed on Mar. 8, 2022.

* cited by examiner

*Primary Examiner* — Sitaramarao S Yechuri
(74) *Attorney, Agent, or Firm* — IPUSA, PLLC

(57)                ABSTRACT

A first gate drive outputs a first drive voltage to turn a first transistor on upon occurrence of a condition in which a voltage at a supply terminal is higher than a voltage at a ground terminal, the output first drive voltage being higher than the voltage at the ground terminal. A second gate drive outputs a second drive voltage to turn a second transistor on, upon occurrence of a condition in which the voltage at the supply terminal is lower than the voltage at the ground terminal, the output second drive voltage being higher than the voltage at the supply terminal.

9 Claims, 7 Drawing Sheets

1

1

1

1

1A

PROTECTION CIRCUIT AND SEMICONDUCTOR INTEGRATED CIRCUIT DEVICE

CROSS-REFERENCE TO RELATED APPLICATIONS

This application is a continuation application of International Application No. PCT/JP2021/043945, filed on Nov. 30, 2021, and designating the U.S., which is based upon and claims priority to Japanese Patent Application No. 2021-016136, filed on Feb. 3, 2021, the entire contents of which are incorporated herein by reference.

BACKGROUND

1. Field of the Invention

The present disclosure relates to a protection circuit for preventing an overcurrent caused by a reverse connection of a power source, and relates to a semiconductor integrated circuit device including the protection circuit.

2. Description of the Related Art

When a supply voltage having a reverse polarity is accidentally applied to an integrated circuit, a parasitic diode existing in a transistor or the like in an integrated circuit becomes in an on state, and thus an excessive current may flow through the integrated circuit. Patent Document 1 illustrated below describes a protection circuit for preventing an overcurrent due to such a reverse connection of a power supply.

RELATED-ART DOCUMENT

Patent Document

[Patent Document 1] Japanese Unexamined Patent Application Publication No. 2014-11233

FIG. 7 is a diagram illustrating the protection circuit described in Patent Document 1. The protection circuit illustrated in FIG. 7 includes transistors M11 to M13 each of which is a p-type metal oxide-semiconductor field effect transistor (MOSFET), and includes resistors R11 to R13. A transistor M13 is provided in a path between a circuit 100 and a supply terminal TP, and a gate of the transistor M13 is coupled to a ground terminal TG via a resistor R13. If a normal supply voltage is applied to the supply terminal TP and the ground terminal TG, the voltage at a source (a terminal on a supply terminal TP-side) of the transistor M13 becomes higher than the voltage at the gate of the transistor M13, because a voltage VDD at the supply terminal TP is higher than a voltage VSS at the ground terminal TG. As a result, the transistor M13 becomes in an on state. In this case, the supply voltage is applied to the circuit 100 via the transistor M13, and thus a current Idd flows through the circuit 100. In contrast, if the source voltage having a reverse polarity is applied to the supply terminal TP and the ground terminal TG, the voltage at a drain (a terminal on a circuit 100-side) of the transistor M13 becomes lower than the voltage at the gate, and thus the transistor M13 becomes in an off state. With this arrangement, the current Idd can be prevented from flowing through the circuit 100 excessively.

In the protection circuit illustrated in FIG. 7, bulks of the transistors M11 to M13 are included in a common N-type impurity diffusion region (N well), and are in electric communication with a common node Nc. A transistor M11 is provided in a path between the common node Nc and the supply terminal TP, and a transistor M12 is provided in a path between the common node Nc and the supply terminal TP. The gate of the transistor M11 is coupled to the ground terminal TG via a resistor R11, and the gate of a transistor M12 is coupled to the supply terminal TP via a resistor R12. If the voltage VDD at the supply terminal TP is higher than the voltage VSS at the ground terminal TG, the transistor M11 is on and the transistor M12 is off. Thus, a voltage VBLK at the bulk of each of the transistors M11 to M13 is approximately equal to the voltage VDD at the supply terminal TP. If the voltage VSS at the ground terminal TG is higher than the voltage VDD at the supply terminal TP, the transistor M11 is off and the transistor M12 is on. Thus, the voltage VBLK at each bulk is approximately equal to the voltage VSS at the ground terminal TG. That is, the bulk voltage VBLK is approximately equal to a higher one of the voltage VDD and the voltage VSS. With this arrangement, a reverse voltage is applied to a parasitic diode that is formed between the bulk (N well) of each of the transistors M11 to M13 and a P-type region (P well or the like) in contact with the bulk, and thus the parasitic diode becomes in an off state. With this arrangement, if the supply voltage (VSS>VDD) having the reverse polarity is applied, an excessive current can be prevented from flowing through the parasitic diode of each of the transistors M11 to M13.

A gate withstanding voltage (each of a maximum magnitude of the voltage between the gate and the source, and a maximum value of the voltage between the gate and the drain) of the P-type MOSFET differs depending on a voltage polarity of each of the source and the drain, with respect to a gate voltage. That is, typically, the gate withstanding voltage in a case where the gate is at a lower potential than the source (in a case where a channel is formed) is lower than the gate withstanding voltage in a case where the gate is at a higher potential than the source (in a case where no channel is formed). With this arrangement, if the supply voltage is higher than a normal voltage in the protection circuit illustrated in FIG. 7, the gate withstanding voltage of the transistor M11 may become insufficient in a case where the polarity of the supply voltage is in a normal state (VDD>VSS). Also, the gate withstanding voltage of the transistor M12 may become insufficient in a case where the polarity of the supply voltage is reversed (VSS>VDD).

For in-vehicle electronic devices, there are cases where a battery voltage (for example, the maximum voltage of 16 V) may be directly used as a supply voltage due to miswiring or failures. For this reason, in order to operate normally even in a case where an excessive supply voltage is applied, a transistor having a high gate withstanding voltage needs to be used as each of the transistors M11 and M12.

In view of the situation described above, it is an object of the present disclosure to provide a protection circuit and a semiconductor integrated circuit device including the protection circuit that is capable of reducing a gate withstanding voltage of a transistor.

SUMMARY

In a first aspect of the present disclosure, a protection circuit for preventing an overcurrent caused by applying a supply voltage having a reverse polarity to a circuit to which power is supplied via a ground terminal and a supply terminal is provided. The protection circuit includes a first transistor including a gate and a bulk, and being a p-type field effect transistor (FET), the first transistor being provided in a path between the supply terminal and a common node. The protection circuit includes a second transistor including a gate and a bulk, and being the p-type FET, the second transistor being provided in a path between the ground terminal and the common node. The protection circuit includes a third transistor including a bulk, and being the p-type FET, and the third transistor being provided in a path between the supply terminal and the circuit. The protection circuit includes a first gate drive configured to output a first drive voltage to the gate of the first transistor. The protection circuit includes a second gate drive configured to output a second drive voltage to the gate of the second transistor. The bulk of each of the first transistor, the second transistor, and the third transistor is in communication with the common node. The first gate drive is configured to output the first drive voltage to turn the first transistor off, upon occurrence of a condition in which a voltage at the supply terminal is lower than a voltage at the ground terminal. The first gate drive is configured to output the first drive voltage to turn the first transistor on, upon occurrence of a condition in which the voltage at the supply terminal is higher than the voltage at the ground terminal, the output first drive voltage being higher than the voltage at the ground terminal. The second gate drive is configured to output the second drive voltage to turn the second transistor off, upon occurrence in a condition in which the voltage at the supply terminal is higher than the voltage at the ground terminal. The second gate drive is configured to output the second drive voltage to turn the second transistor on, upon occurrence of a condition in which the voltage at the supply terminal is lower than the voltage at the ground terminal, the output second drive voltage being higher than the voltage at the supply terminal.

In the protection circuit in the first aspect, if a voltage at a supply terminal is higher than a voltage at a ground terminal, a first transistor is turned on in accordance with a first drive voltage, and a second transistor is turned off in accordance with a second drive voltage. In this case, a voltage corresponding to the voltage at the supply terminal is applied to each bulk of the first transistor, the second transistor, and a third transistor, and thus each parasitic diode that is formed in the bulk becomes in an off state. Therefore, an overcurrent does not flow through the parasitic diode.

In contrast, if the voltage at the ground terminal is higher than the voltage at the supply terminal, contrary to the above condition, the first transistor is turned off and the second transistor is turned on, and thus a voltage corresponding to the voltage at the ground terminal is applied to each bulk of the first transistor, the second transistor, and the third transistor. In this case as well, each parasitic diode formed in the bulk becomes in an off state, and an overcurrent does not flow through the parasitic diode.

In addition, if the voltage at the supply terminal is higher than the voltage at the ground terminal, a first drive voltage that is applied to the gate of the first transistor becomes higher than the voltage at the ground terminal. Thus, a withstanding voltage between a gate and a source of the first transistor, and a withstanding voltage between the gate and a drain of the first transistor are reduced, in comparison to a case where the voltage at the gate of the first transistor is equal to the voltage at the ground terminal.

Further, if the voltage at the supply terminal is lower than the voltage at the ground terminal, a second drive voltage that is applied to the gate of the second transistor becomes higher than the voltage at the supply terminal. Thus, a withstanding voltage between a gate and a source of the second transistor, and a withstanding voltage between the gate and a drain of the second transistor are reduced, in comparison to a case where the voltage at the gate of the second transistor is equal to the voltage at the supply terminal.

In a second aspect of the present disclosure, the first gate drive may include a first rectifier provided in a path between the supply terminal and the gate of the first transistor, the first rectifier being configured to become conductive, upon occurrence of a condition in which the voltage at the supply terminal is higher than a voltage at the gate of the first transistor, and to be turned off, upon occurrence of a condition in which the voltage at the supply terminal is lower than the voltage at the gate of the first transistor. The first gate drive may include a first resistor provided in a path between the gate of the first transistor and the ground terminal. The second gate drive may include a second rectifier provided in a path between the ground terminal and the gate of the second transistor, the second rectifier being configured to become conductive, upon occurrence of a condition in which the voltage at the ground terminal is higher than the voltage at the gate of the second transistor, and to be turned off, upon occurrence of a condition in which the voltage at the ground terminal is lower than the voltage at the gate of the second transistor. The second gate drive may include a second resistor provided in a path between the gate of the second transistor and the supply terminal.

With this arrangement, if a voltage at a supply terminal is higher than a voltage at a ground terminal, the voltage at the supply terminal becomes higher than a voltage at a gate of a first transistor, and thus a first rectifier becomes conductive. In this case, because a voltage drop across the first resistor occurs due to a current flowing through the first rectifier, a first drive voltage that is applied to the gate of the first transistor becomes higher than the voltage at the ground terminal. Further, in this case, because the voltage at the ground terminal becomes lower than a voltage at a gate of a second transistor, and thus a second rectifier is turned off, a voltage at a gate of a second transistor becomes approximately equal to the voltage at the supply terminal.

In contrast, if the voltage at the supply terminal is lower than the voltage at the ground terminal, the voltage at the ground terminal becomes higher than the voltage at the gate of the second transistor, and thus a second rectifier becomes conductive. In this case, because a voltage drop across a second resistor occurs due to a current flowing through the second rectifier, a second drive voltage that is applied to the gate of the second transistor becomes higher than the voltage at the supply terminal. Further, in this case, because the voltage at the supply terminal becomes lower than the voltage at the gate of the first transistor, and thus the first rectifier is turned off, the voltage at the gate of the first transistor becomes approximately equal to the voltage at the ground terminal.

In a third aspect of the present disclosure, the first rectifier may include a fourth transistor provided in the path between the supply terminal and the gate of the first transistor, the fourth transistor being the p-type FET and including a gate electrically coupled to the gate of the first transistor. The second rectifier may include a fifth transistor provided in the path between the ground terminal and the gate of the second transistor, the second rectifier being the p-type FET and including gate electrically coupled to the gate of the second transistor.

With this arrangement, if a voltage at a supply terminal is higher than a voltage at a ground terminal, a voltage at a gate of a fourth transistor becomes lower than the voltage at the supply terminal, and thus a current flows through the fourth transistor. When the current flows from the fourth transistor to a first resistor, a voltage drop across the first resistor occurs, and thus a first drive voltage that is applied to a gate of a first transistor becomes higher than the voltage at the ground terminal. In this case, because a voltage at a gate of a fifth transistor becomes higher than the voltage at the ground terminal, and thus the fifth transistor is turned off, a voltage at a gate of the second transistor becomes approximately equal to the voltage at the supply terminal.

In contrast, if the voltage at the supply terminal is lower than the voltage at the ground terminal, the voltage at the gate of the fifth transistor becomes lower than the voltage at the ground terminal, and thus a current flows through the fifth transistor. When the current flows from the fifth transistor to the second resistor, a voltage drop across the second resistor occurs, and thus a second drive voltage that is applied to the gate of the second transistor becomes higher than the voltage at the supply terminal. In this case, because the voltage at the gate of the fourth transistor becomes higher than the voltage at the supply terminal, and thus the fourth transistor is turned off, the voltage at the gate of the first transistor becomes approximately equal to the voltage at the ground terminal.

In a fourth aspect of the present disclosure, a bulk of each of the fourth transistor and the fifth transistor may be in communication with the common node.

With this arrangement, a voltage corresponding to a higher one of a voltage at a supply terminal and a voltage at a ground terminal is applied to a common node. As a result, parasitic diodes formed in the bulk of a fourth transistor and a bulk of a fifth transistor become in an off state, so that an overcurrent does not flow through each of the parasitic diodes.

In a fifth aspect of the present disclosure, the bulk of each of the first transistor, the second transistor, the third transistor, the fourth transistor, and the fifth transistor may be included in a common n-type impurity diffusion region.

With this arrangement, respective bulks of a first transistor, a second transistor, a third transistor, a fourth transistor, and a fifth transistor are in communication with a common n-type impurity diffusion region. Thus, it is not necessary to provide any line with which each bulk becomes conductive, thereby reducing a layout area.

In a sixth aspect of the present disclosure, the protection circuit may further include a third gate drive configured to output a third drive voltage to the gate of the third transistor. The third gate drive may be configured to output the third drive voltage to turn the third transistor off, upon occurrence of a condition in which the voltage at the supply terminal is lower than the voltage at the ground terminal. The third gate drive may be configured to output the third drive voltage to turn the third transistor on, upon occurrence of a condition in which the voltage at the supply terminal is higher than the voltage at the ground terminal.

With this arrangement, if a voltage at a supply terminal is higher than a voltage at a ground terminal, a third transistor is turned on, and thus a supply voltage is applied to a circuit via the third transistor. If the voltage at the supply terminal is lower than the voltage at the ground terminal, the third transistor is turned off, and thus a path of a current that flows from the ground terminal to the supply terminal via the circuit is interrupted. Thus, an overcurrent does not flow through the path.

In a seventh aspect of the present disclosure, the third gate drive may include a third resistor provided in a path between the gate of the third transistor and the ground terminal.

In an eighth aspect of the present disclosure, the circuit may include an n-type FET including a bulk in communication with the ground terminal. The n-type FET may be provided in a path between the gate of the third transistor and the ground terminal.

With this arrangement, a bulk of an n-type FET is in communication with a ground terminal. If a voltage at the ground terminal is higher than a voltage at a supply terminal, a parasitic diode that is formed between the bulk and a drain region of the n-type FET becomes conductive, and thus a voltage at a gate of a third transistor becomes close to a magnitude of a voltage at the ground terminal. As a result, the third transistor is turned off, and the path of a current that flows from a circuit to the supply terminal via the third transistor is interrupted. Thus, an overcurrent does not flow through this path.

In a ninth aspect of the present disclosure, a semiconductor integrated circuit device includes a circuit to which power is configured to be supplied via a ground terminal and a supply terminal, and includes the protection circuit in the first aspect.

DESCRIPTION OF THE EMBODIMENTS

A semiconductor integrated circuit device according to a first embodiment will be described below with reference to the drawings.

Figure 1:
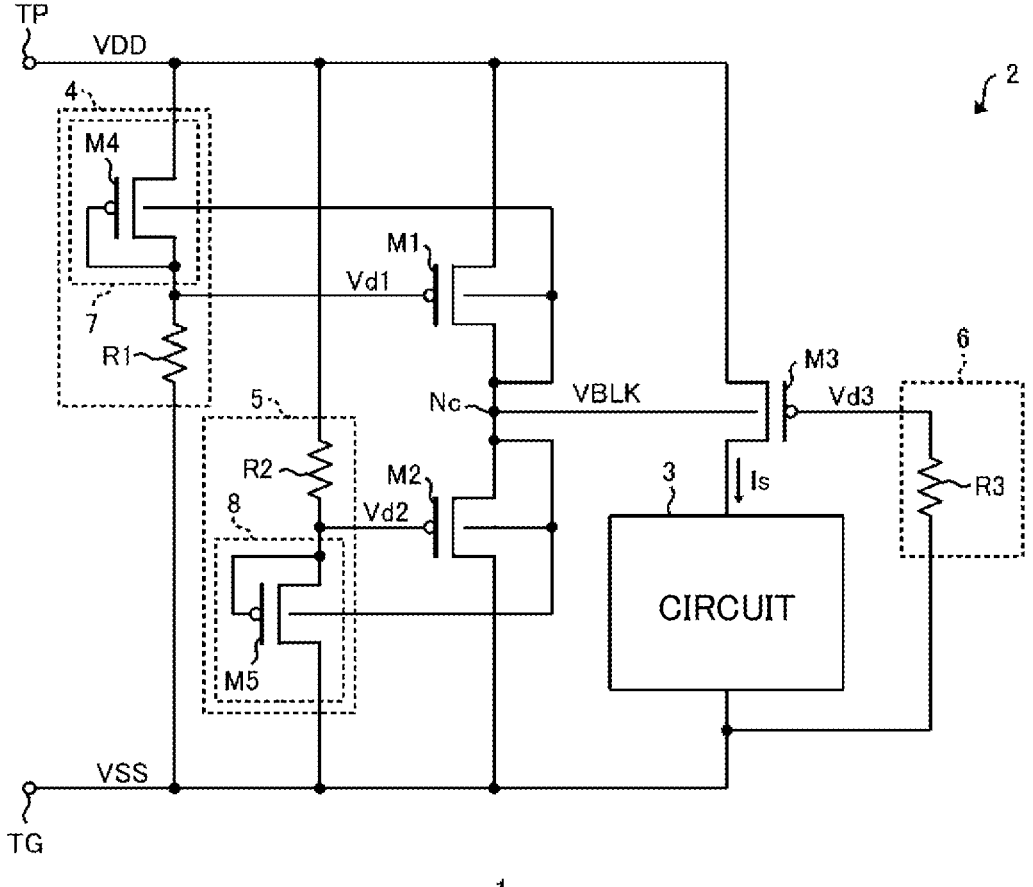
FIG. 1 is a diagram illustrating a configuration example of a semiconductor integrated circuit device according to a first embodiment.

FIG. 1 is a diagram illustrating a configuration example of a semiconductor integrated circuit device 1 according to the first embodiment. The semiconductor integrated circuit device 1 illustrated in FIG. 1 includes a circuit 3 to which a supply voltage is supplied via a supply terminal TP and a ground terminal TG, and includes a protection circuit 2 to prevent an overcurrent that flows by applying the supply voltage having a reverse polarity to the circuit 3. In this description, it is assumed that, if a voltage VDD at the supply terminal TP is higher than a voltage VSS at the ground terminal TG, the supply voltage applied to the circuit 3 has a correct polarity, and if the voltage VDD is lower than the voltage VSS, the supply voltage applied to the circuit 3 has a reverse polarity.

In the example in FIG. 1, the protection circuit 2 includes a first transistor M1, a second transistor M2, and a third transistor M3. These transistors are p-type MOSFETs. The protection circuit 2 also includes a first gate drive 4, a second gate drive 5, and a third gate drive 6. The first gate drive 4 outputs a first drive voltage Vd1 to a gate of the first transistor M1, the second gate drive 5 outputs a second drive voltage Vd2 to a gate of the second transistor M2, and the third gate drive 6 outputs a third drive voltage Vd3 to a gate of the third transistor M3.

The third transistor M3 is provided in a path between the supply terminal TP and the circuit 3. The first transistor M1 is provided in a path between the supply terminal TP and a common node Nc. The second transistor M2 is provided in a path between a ground terminal TG and the common node Nc. A bulk (an n-type impurity diffusion region including a p-type channel formation region) of each of the first transistor M1, the second transistor M2, and the third transistor M3 is in communication with the common node Nc.

If the voltage VDD at the supply terminal TP is lower than the voltage VSS at the ground terminal TG, the first gate drive 4 outputs the first drive voltage Vd1 to turn the first transistor M1 off. If the voltage VDD at the supply terminal TP is higher than the voltage VSS at the ground terminal TG, the first gate drive 4 outputs the first drive voltage Vd1 to turn the first transistor M1 on, where the output first drive voltage Vd1 is higher than the voltage VSS at the ground terminal TG.

The first gate drive 4 includes a first rectifier 7 and a first resistor R1, as illustrated in the example in FIG. 1. The first rectifier 7 is provided in a path between the supply terminal TP and the gate of the first transistor M1. If the voltage VDD at the supply terminal TP is higher than the voltage at the gate of the first transistor M1, the first rectifier 7 becomes conductive, and if the voltage VDD at the supply terminal TP is lower than the voltage at the gate of the first transistor M1, the first rectifier 7 is turned off. The first resistor R1 is provided in a path between the gate of the first transistor M1 and the ground terminal TG.

As illustrated in the example in FIG. 1, the first rectifier 7 includes a fourth transistor M4 that is a p-type MOSFET. The fourth transistor M4 is provided in the path between the supply terminal TP and the gate of the first transistor M1, and a gate of the fourth transistor M4 is coupled to the gate of the first transistor M1.

If the voltage VDD at the supply terminal TP is higher than the voltage VSS at the ground terminal TG, the second gate drive 5 outputs the second drive voltage Vd2 to turn the second transistor M2 off. If the voltage VDD at the supply terminal TP is lower than the voltage VSS at the ground terminal TG, the second gate drive 5 outputs the second drive voltage Vd2 to turn the second transistor M2 on, where the output second drive voltage Vd2 is higher than the voltage VDD at the supply terminal TP.

The second gate drive 5 includes a second rectifier 8 and a second resistor R2, as illustrated in the example in FIG. 1. The second rectifier 8 is provided in a path between the ground terminal TG and the gate of the second transistor M2. If the voltage VSS at the ground terminal TG is higher than the voltage at the gate of the second transistor M2, the second rectifier 8 becomes conductive. If the voltage VSS at the ground terminal TG is lower than the voltage at the gate of the second transistor M2, the second rectifier 8 is turned off. The second resistor R2 is provided in a path between the gate of the second transistor M2 and the supply terminal TP.

As illustrated in the example in FIG. 1, the second rectifier 8 includes a fifth transistor M5 that is a p-type MOSFET.

The fifth transistor M5 is provided in the path between the ground terminal TG and the gate of the second transistor M2, and a gate of the fifth transistor M5 is coupled to the gate of the second transistor M2.

Bulks (n-type impurity diffusion regions including p-type channel formation regions) of the fourth transistor M4 and the fifth transistor M5 are in communication with the common node Nc.

Figure 2:
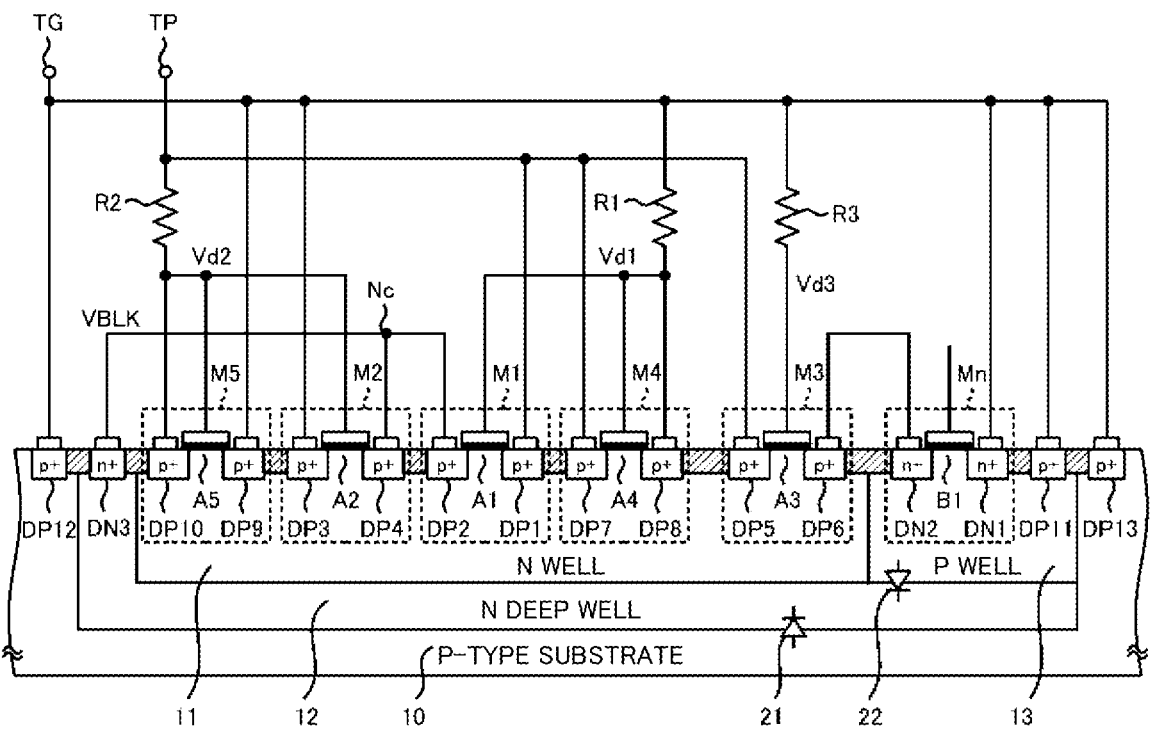
FIG. 2 is a vertical cross-sectional view schematically illustrating a structure example of the semiconductor integrated circuit device illustrated in FIG. 1.

FIG. 2 is a vertical cross-sectional view schematically illustrating a structure example of the semiconductor integrated circuit device 1 illustrated in FIG. 1. In the example in FIG. 2, the semiconductor integrated circuit device 1 is formed on a p-type semiconductor substrate 10 (hereinafter also referred to as a "p-type substrate 10") made of silicon or the like to which a p-impurity (acceptor) such as boron or aluminum is added).

An N well 11 and an N deep well 12 are formed on one surface of the p-type substrate 10, and the N well 11 and the N deep well 12 constitute an n-type impurity diffusion region into which n-type impurities (donors) such as phosphorus or arsenic are diffused by ion implantation or the like. The N deep well 12 is a region including a relatively deep region that is defined when viewed from the surface of the P-type substrate 10. The N well 11 is a region including a relatively shallow region that is defined when viewed from the surface of the P-type substrate 10, and the N well 11 is formed inside the N deep well 12. P-type regions DP1 to DP10 doped in high concentration are formed inside the N well 11, and the p-type regions DP1 to DP10 are p-type impurity diffusion regions into which p-type impurities are diffused in high concentration.

A channel formation region A1 of the first transistor M1 is disposed between p-type regions DP1 and DP2, and the p-type regions DP1 and DP2 form a drain and a source of the first transistor M1, respectively. A channel formation region A2 of the second transistor M2 is disposed between p-type regions DP3 and DP4, and the p-type regions DP3 and DP4 form a drain and a source of the second transistor M2, respectively. A channel formation region A3 of the third transistor M3 is disposed between p-type regions DP5 and DP6, and p-type regions DP5 and DP6 form a drain and a source of the third transistor M3, respectively. A channel formation region A4 of the fourth transistor M4 is disposed between p-type regions DP7 and DP8, and the p-type regions DP7 and DP8 form a drain and a source of the fourth transistor M4, respectively. A channel formation region A5 of the fifth transistor M5 is disposed between p-type regions DP9 and DP10, and the p-type regions DP9 and DP10 form a drain and a source of the fifth transistor M5, respectively. Each of the p-type regions DP1 to DP10 in the first transistor M1 to the fifth transistor M5 is in communication with an electrode that is formed of a conductor film such as poly-silicon.

In proximity to the channel formation regions A1 to A5 in the first transistor M1 to the fifth transistor M5, corresponding gate electrodes are each arranged using an insulating film such as a silicon oxide film. Each gate electrode is formed by a conductor film such as polysilicon.

In the example in FIG. 2, the channel formation regions A1 to A5 of the first transistor M1 to the fifth transistor M5 are included in a common n-type impurity diffusion region (the N well 11 and the N deep well 12). That is, the respective bulks of the first transistor M1 to the fifth transistor M5 are included in the common n-type impurity diffusion region (the N well 11 and the N deep well 12), and the bulks are in communication with one another.

In the example in FIG. 2, a P well 13 is formed inside the N deep well 12. The P well 13 is a p-type impurity diffusion region into which a p-type impurity is diffused by ion implantation or the like, and n-type regions DN1 and DN2 doped in high concentration are formed inside the P well 13. The n-type regions DN1 and DN2 are n-type impurity diffusion regions into which n-type impurities are diffused in high concentration. A channel formation region B1 of a transistor Mn, which is an n-type MOSFET included in the circuit 3, is disposed between the n-type regions DN1 and DN2, and the n-type regions DN1 and DN2 form a drain and a source of the transistor Mn, respectively. The n-type regions DN1 and DN2 of the transistor Mn are respectively in communication with electrodes each of which is formed of a conductive film such as polysilicon. In proximity to the channel formation region B1, a gate electrode (a conductive film such as polysilicon) is disposed using an insulating film (silicon oxide film or the like). The circuit 3 may include two or more transistors Mn. In this case, each transistors Mn that is coupled to the supply terminal TP via the third transistor M3 may be formed in the P well 13, as illustrated in FIG. 2.

A n-type region DN3 doped in high concentration is formed in the N deep well 12, and the n-type region DN3 is coupled to the common node Nc via a line (a conductor film such as polysilicon). With this arrangement, the voltage at each bulk of the first transistor M1 to the fifth transistor M5 is equal to the voltage VBLK at the common node Nc.

The p-type region DP11 doped in high concentration is formed in the P well 13, and the p-type region DP11 is coupled to the ground terminal TG via a line (a conductor film such as polysilicon). With this arrangement, a bulk voltage of the transistor Mn in the circuit 3 is equal to the voltage VSS at the ground terminal TG.

In the P-type substrate 10, p-type regions DP12 and DP13 doped in high concentration are formed to be coupled to the ground terminal TG via a line (a conductor film such as polysilicon). With this arrangement, the voltage of the P-type substrate 10 is equal to the voltage VSS at the ground terminal TG.

Isolation regions (regions expressed by a hatch in FIG. 2) for isolation are each formed between adjacent regions where transistors (among the first transistor M1 to the fifth transistor M5 and the transistor Mn) are formed. Each isolation region has a structure such as a shallow trench isolation (STI) structure.

Hereinafter, the operation of the semiconductor integrated circuit device 1 having the above configuration will be described.

A case where the supply voltage having a correct polarity is applied to the supply terminal TP and the ground terminal TG will be described. In the following description, the voltage VSS at the ground terminal TG is 0 V (VSS=0 V) and the polarity of the voltage VDD at the supply terminal TP is positive (VDD>0 V).

In this case, the third drive voltage Vd3 that is applied to the gate of the third transistor M3 becomes 0 v, and thus the voltage VDD is applied to the source (high-side terminal) of the third transistor M3, so that the third transistor M3 is turned on. With this arrangement, the supply voltage is applied to the circuit 3 via the third transistor M3.

In addition, in this case, the voltage VDD is applied to the source (high-side terminal) of the first transistor M1, and thus the voltage (first drive voltage Vd1) of the gate of the first transistor M1 becomes lower than the voltage VDD at the source of the first transistor M1. As a result, the first transistor M1 is turned on. Also, as in the first transistor M1, the voltage (first drive voltage Vd1) of the gate of the fourth transistor M4 becomes lower than the voltage VDD at the source of the fourth transistor M4, and thus the fourth transistor M4 becomes conductive. The current flows from the supply terminal TP into the first resistor R1 via the fourth transistor M4. The first drive voltage Vd1 becomes higher than the voltage VSS (=0 V) due to a voltage drop across the first resistor R1.

Further, in this case, the voltage VDD is applied to the gate of the fifth transistor M5 via the second resistor R2, and thus the voltages at the source (high-side terminal) and the gate of the fifth transistor M5 are equal to each other. As a result, the fifth transistor M5 is turned off. When the fifth transistor M5 is turned off, the voltage VDD is applied to the gate of the second transistor M2. In this case, because the first transistor M1 is on, the voltage VDD is applied to the source (high-side terminal) of the second transistor M2 via the first transistor M1. With this arrangement, voltages at the source (high-side terminal) and the gate of the second transistor M2 are approximately equal to each other, and thus the second transistor M2 is turned off.

When the first transistor M1 is turned on and the second transistor M2 is turned off, the voltage VDD is applied to the common node Nc.

Figure 3A:
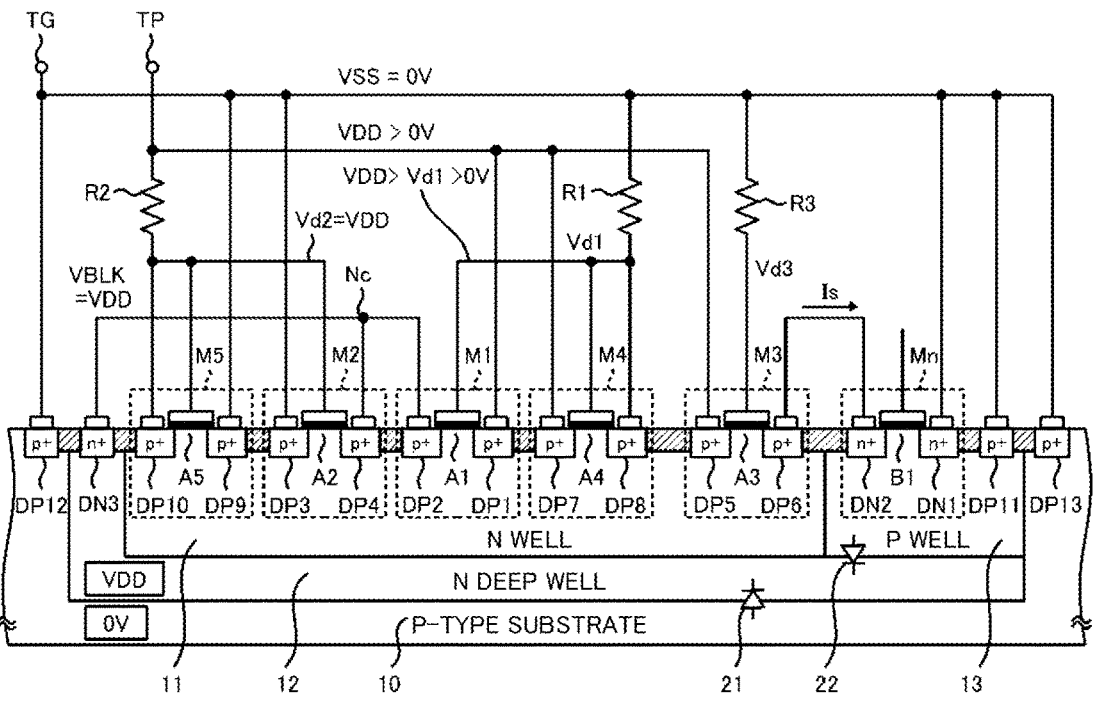
FIG. 3A is a diagram for describing the voltage at each component in a case where a polarity of a supply voltage is correct.

FIG. 3A is a diagram for describing the voltage at each component of the semiconductor integrated circuit device 1 in a case where the supply voltage having a correct polarity is applied to the supply terminal TP and the ground terminal TG (VSS=0 V and VDD>0 V).

When the voltage VDD is applied to the common node Nc, the voltage VBLK at the n-type impurity diffusion region (the N well 11 and the N deep well 12) including the bulks of the first transistor M1 to the fifth transistor M5 is equal to the voltage VDD, as illustrated in FIG. 3A. In contrast, because the P-type substrate 10 and the P well 13 are coupled to the ground terminal TG, voltages of the P-type substrate 10 and the P well 13 become 0 V. In this case, each of a parasitic diode 21 and a parasitic diode 22 becomes in off state, because a cathode voltage of the parasitic diode is higher than an anode voltage, where the parasitic diode 21 is formed between the N deep well 12 and the P-type substrate 10, and the parasitic diode 22 is formed between the N deep well 12 and the P well 13. That is, each parasitic diode of which a cathode is disposed on a same side as the n-type impurity diffusion region (the N well 11 and the N deep well 12) becomes in the off state.

Hereinafter, a case where the supply voltage having a reverse polarity is applied to the supply terminal TP and the ground terminal TG will be described. In the following description, the voltage VDD at the supply terminal TP is 0 V (VDD=0 V), and the polarity of the voltage VSS at the ground terminal TG is positive (VSS>0 V).

In this case, the third drive voltage Vd3 that is applied to the gate of the third transistor M3 becomes the voltage VSS, and a voltage that is applied to the source (high-side terminal) of the third transistor M3 becomes lower than or equal to the voltage VSS. As a result, the third transistor M3 is turned off. With this arrangement, the supply voltage is not applied to the circuit 3, and thus a current Is through the circuit 3 becomes 0. Therefore, even when the supply voltage having a reverse polarity is applied, an excessive current does not flow from the ground terminal TG to the supply terminal TP via the circuit 3 and the third transistor M3.

Also, in this case, the voltage VSS is applied to the source (high-side terminal) of the second transistor M2, and thus a voltage (second drive voltage Vd2) at the gate of the second transistor Vd2 becomes lower than the voltage VSS at the source of the second transistor M2. As a result, the second transistor M2 is turned on. Also, as in the second transistor M2, because the voltage (second drive voltage Vd2) of the gate of the fifth transistor M5 becomes lower than the voltage VSS at the source of the fifth transistor M5, the fifth transistor M5 becomes conductive. The current flows from the ground terminal TG to the second resistor R2 via the fifth transistor M5. The second drive voltage Vd2 becomes higher than the voltage VDD (=0 V) due to a voltage drop across the second resistor R2.

Further, in this case, because the voltage VSS is applied to the gate of the fourth transistor M4 via the first resistor R1, voltages at the source and the gate of the fourth transistor M4 become equal to each other, and thus the fourth transistor M4 is turned off. When the fourth transistor M4 is turned off, the voltage VSS is applied to the gate of the first transistor M1. In this case, because the second transistor M2 is on, the voltage VSS is applied to the source (high-side terminal) of the first transistor M1 via the second transistor M2. With this arrangement, voltages at the source (high-side terminal) and the gate of the first transistor M1 become approximately equal to each other, and thus the first transistor M1 is turned off.

When the first transistor M1 is turned off and the second transistor M2 is turned on, the voltage VSS is applied to the common node Nc.

Figure 3B:
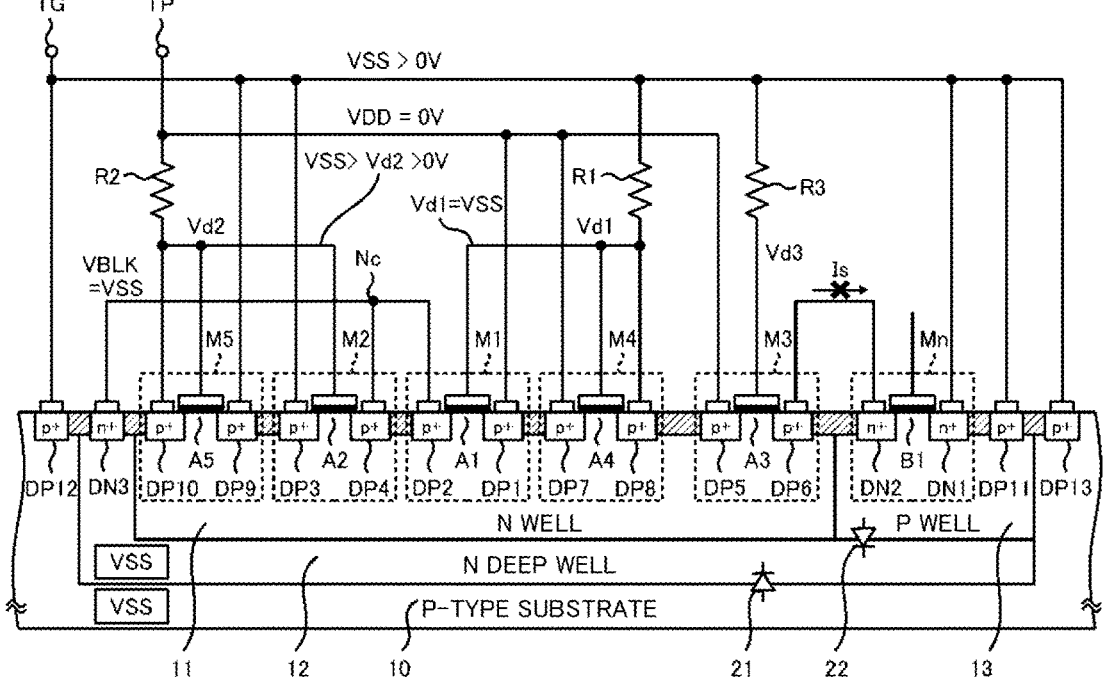
FIG. 3B is a diagram for describing the voltage at each component in a case where the polarity of the supply voltage is reversed.

FIG. 3B is a diagram for describing the voltage at each component of the semiconductor integrated circuit device 1 in a case where the supply voltages having a reverse polarity is applied to the supply terminal TP and the ground terminal TG (VDD=0 V and VSS>0 V). When the voltage VSS is applied to the common node Nc, the voltage VBLK at the n-type impurity diffusion region (the N well 11 and the N deep well 12) including the bulks of the first transistor M1 to the fifth transistor M5 illustrated in FIG. 3B becomes equal to the voltage VSS. Also, because the P-type substrate 10 and the P well 13 are coupled to the ground terminal TG, the voltage of each of the P-type substrate 10 and the P well 13 also becomes the voltage VSS. In this case, each of the parasitic diode 21 and the parasitic diode 22 becomes in an off state, because a cathode voltage, and an anode voltage, of the parasitic diode are equal to each other. The parasitic diode 21 is formed between the N deep well 12 and the P-type substrate 10, and the parasitic diode 22 is formed between the N deep well 12 and the P well 13. That is, each parasitic diode of which the cathode is disposed on a same side as the n-type impurity diffusion region (the N well 11 and the N deep well 12) becomes in the off state. Therefore, even when the supply voltage having a reverse polarity is applied, an excessive current does not flow through each of the parasitic diodes (21 and 22) that is formed between the n-type impurity diffusion region (the N well 11 and the N deep well 12) and the bulk of a corresponding transistor among the first transistor M1 to the fifth transistor M5.

As described above, according to the present embodiment, if the voltage VDD at the supply terminal TP is higher than the voltage VSS at the ground terminal TG (VDD>VSS), the first transistor M1 is turned on in accordance with the first drive voltage Vd1, and the second transistor M2 is turned off in accordance with the second drive voltage Vd2. In this case, a voltage corresponding to the voltage VDD is applied to each of the bulks of the first transistor M1 to the third transistor M3, and thus the parasitic diodes (21, 22) formed in the bulks become in an off state. In contrast to the above case, if the voltage VSS at the ground terminal TG is higher than the voltage VDD at the supply terminal TP (VSS>VDD). That is, the first transistor M1 is turned off and the second transistor M2 is turned on, and thus a voltage corresponding to the voltage VSS is applied to each bulk of the first transistor M1 to the third transistor M3. In this case, the parasitic diodes (21, 22) formed in the bulks become in an off state. That is, the parasitic diodes (21, 22) formed in the bulks of the first transistor M1 to the third transistor M3 become in the off state, regardless of the polarity of the supply voltage that is applied to the supply terminal TP and the ground terminal TG. With this arrangement, even when the supply voltage having a reverse polarity is applied, an overcurrent can be prevented from flowing through each parasitic diode (21, 22).

According to the present embodiment, if the voltage VDD at the supply terminal TP is higher than the voltage VSS at the ground terminal TG (VDD>VSS), the first drive voltage Vd1 applied to the gate of the first transistor M1 becomes higher than the voltage VSS at the ground terminal TG. With this arrangement, a withstanding voltage between the gate and the source of the first transistor M1, and a withstanding voltage between the gate and the drain of the first transistor M1 can be reduced, in comparison to a case where the voltage at the gate of the first transistor M1 is equal to the voltage VSS at the ground terminal TG.

According to the present embodiment, if the voltage VDD at the supply terminal TP is lower than the voltage VSS at the ground terminal TG (VSS>VDD), the second drive voltage Vd2 applied to the gate of the second transistor M2 is higher than the voltage VDD at the supply terminal TP. With this arrangement, in comparison to a case where the voltage at the gate of the second transistor M2 is equal to the voltage VDD at the supply terminal TP, a withstanding voltage required between the gate and the source of the second transistor M2, and a withstanding voltage required between the gate and the drain of the second transistor M2 can be reduced.

As described above, the gate withstanding voltages of each of the first transistor M1 and the second transistor M2 can be reduced. With this arrangement, by reducing withstanding voltages of the first transistor M1 and the second transistor M2, the layout area of the circuit can be reduced. In addition, even if withstanding voltages of the first transistor M1 and the second transistor M2 are set without using the reduced withstanding voltages described above, a greater margin of the withstanding voltage in accordance with an increasing supply voltage can be obtained. Thus, reliability of the circuit can be increased.

In addition, according to the present embodiment, the bulks of the first transistor M1 to the fifth transistor M5 are in communication with the common n-type impurity diffusion region (the N well 11 and the N deep well 12). With this arrangement, it is not necessary to provide any line with which each bulk becomes conductive, thereby allowing for a reduced layout area.

Hereinafter, modifications to the semiconductor integrated circuit device 1 will be described.

First Modification

Figure 4:
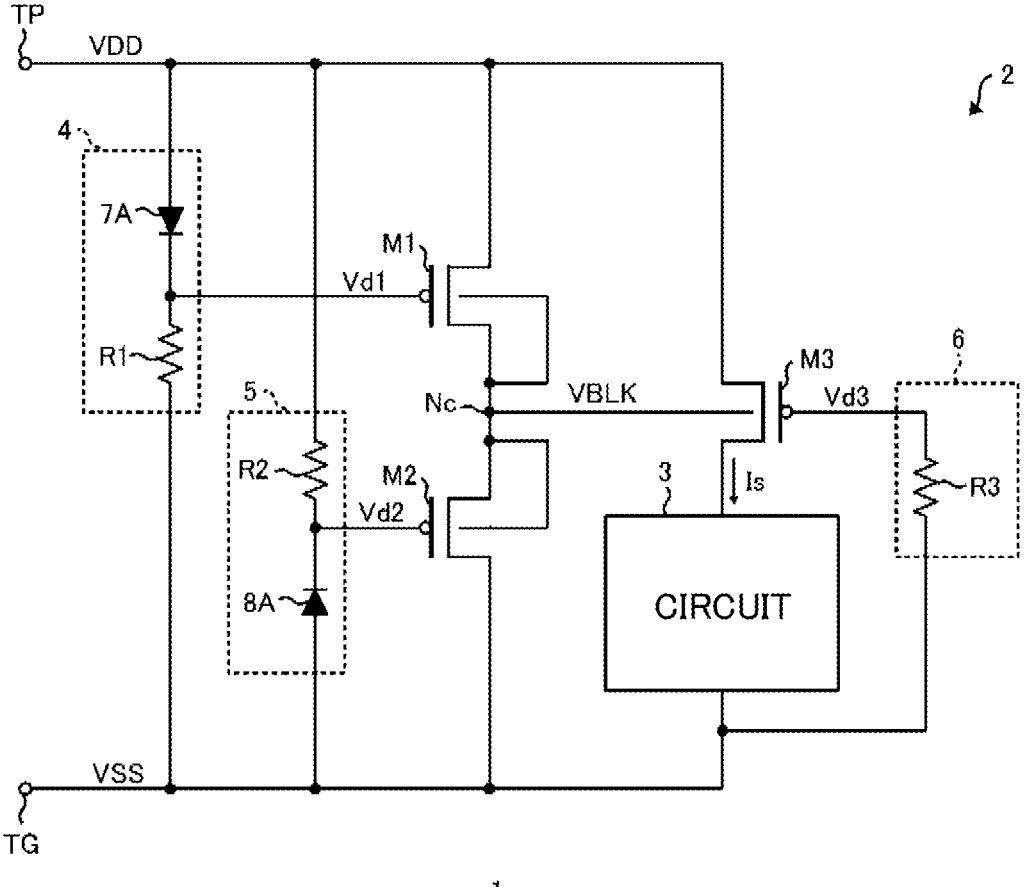
FIG. 4 is a diagram illustrating the semiconductor integrated circuit device in a first modification of the first embodiment.

FIG. 4 is a diagram illustrating the semiconductor integrated circuit device 1 in a first modification.

In the semiconductor integrated circuit device 1 in the first modification illustrated in FIG. 4, a first rectifier 7A is used instead of the first rectifier 7 of the first gate drive 4 in the semiconductor integrated circuit device 1 illustrated in FIG. 1, and a second rectifier 8A is used instead of the second rectifier 8 of the second gate drive 5. Other configurations are the same as those of the semiconductor integrated circuit device 1 illustrated in FIG. 1.

As illustrated in FIG. 4, each of the first rectifier 7A and the second rectifier 8A is a PN junction diode. In the first rectifier 7A, an anode is coupled to the supply terminal TP, and a cathode is coupled to the gate of the first transistor M1. In the second rectifier 8A, an anode is coupled to the ground terminal TG, and a cathode is coupled to the gate of the second transistor M2.

If the voltage VDD is lower than the voltage VSS, the first rectifier 7A becomes in an off state. In this case, the first drive voltage Vd1 is equal to the voltage VSS.

In contrast, if the voltage VDD is higher than the voltage VSS, the first rectifier 7A becomes conductive. In this case, a voltage drop across the first resistor R1 occurs due to the current flowing through the first rectifier 7A, and thus the first drive voltage Vd1 becomes higher than the voltage VSS. With this arrangement, in comparison to a case where the first drive voltage Vd1 is equal to the voltage VSS, a withstanding voltage between the gate and the source of the first transistor M1, and a withstanding voltage between the gate and the drain of the first transistor M1 can be reduced.

If the voltage VDD is higher than the voltage VSS, the second rectifier 8A becomes in an off state. In this case, the second drive voltage Vd2 is equal to the voltage VDD.

In contrast, if the voltage VDD is lower than the voltage VSS, the second rectifier 8A becomes conductive. In this case, a voltage drop across the second resistor R2 occurs due to the current flowing through the second rectifier 8A, and thus the second drive voltage Vd2 becomes higher than the voltage VDD. With this arrangement, in comparison to a case where the second drive voltage Vd2 is equal to the voltage VDD, a withstanding voltage between the gate and the source of the second transistor M2, and a withstanding voltage between the gate and the drain of the second transistor M2 can be reduced.

Second Modification

Figure 5:
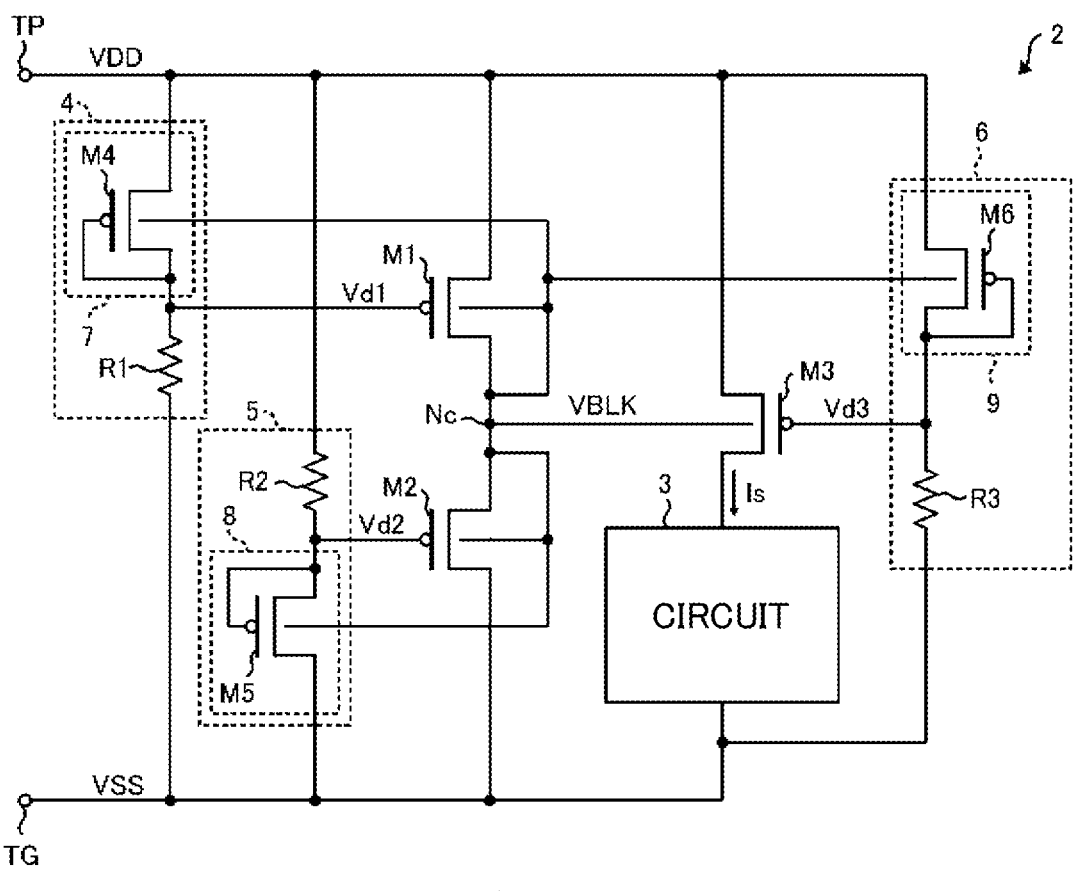
FIG. 5 is a diagram illustrating the semiconductor integrated circuit device in a second modification of the first embodiment.

FIG. 5 is a diagram illustrating the semiconductor integrated circuit device 1 in a second modification.

In the semiconductor integrated circuit device 1 in the second modification as illustrated in FIG. 5, a third rectifier 9 is incorporated in the third gate drive 6. Other configurations are the same as those of the semiconductor integrated circuit device 1 as illustrated in FIG. 1.

The third rectifier 9 is provided in a path between the supply terminal TP and the gate of the third transistor M3. If the voltage VDD at the supply terminal TP is higher than the voltage at the gate of the third transistor M3, the third rectifier 9 becomes conductive, and if the voltage VDD at the supply terminal TP is lower than the voltage at the gate of the third transistor M3, the third rectifier 9 is turned off. The third resistor R3 is provided in a path between the gate of the third transistor M3 and the ground terminal TG.

The third rectifier 9 includes a sixth transistor M6 that is a p-type MOSFET, as illustrated in an example in FIG. 5. The sixth transistor M6 is provided in a path between the supply terminal TP and the gate of the third transistor M3, and a gate of the sixth transistor M6 is coupled to the gate of the third transistor M3. A bulk of the sixth transistor M6 is coupled to the common node Nc. For example, the bulk of the sixth transistor M6 may be included in the n-type impurity diffusion region (the N well 11 and the N deep well 12), as in the bulks of the first transistor M1 to the fifth transistor M5.

If the voltage VDD is lower than the voltage VSS, the voltage VSS is applied to the gate of the sixth transistor M6 via the third resistor R3. With this arrangement, voltages at a source (high-side terminal) and the gate of the sixth transistor M6 are equal to each other, and thus the sixth transistor M6 is turned off. When the sixth transistor M6 is turned off, the voltage VSS is applied to the gate of the third transistor M3, and thus the third transistor M3 is turned off.

In contrast, if the voltage VDD is higher than the voltage VSS, the voltage VDD is applied to the source (high-side terminal) of the sixth transistor M6, and thus the voltage (third drive voltage Vd3) of the gate of the third transistor M3 becomes lower than the voltage VDD at the source of the third transistor M3. As a result, the third transistor M3 is turned on. Also, as in the third transistor M3, the voltage (third drive voltage Vd3) at the gate of the sixth transistor M6 becomes lower than the voltage VDD at the source of the sixth transistor M6, the sixth transistor M6 becomes conductive. A current flows from the supply terminal TP to the third resistor R3 via the sixth transistor M6. The third drive voltage Vd3 becomes higher than the voltage VSS due to a voltage drop across the third resistor R3. With this arrangement, in comparison to a case where the third drive voltage Vd3 is equal to the voltage VSS, a withstanding voltage between the gate and the source of the third transistor M3, and a withstanding voltage between the gate and the drain of the third transistor M3 can be reduced.

Second Embodiment

Hereinafter, the semiconductor integrated circuit device according to a second embodiment will be described.

Figure 6:
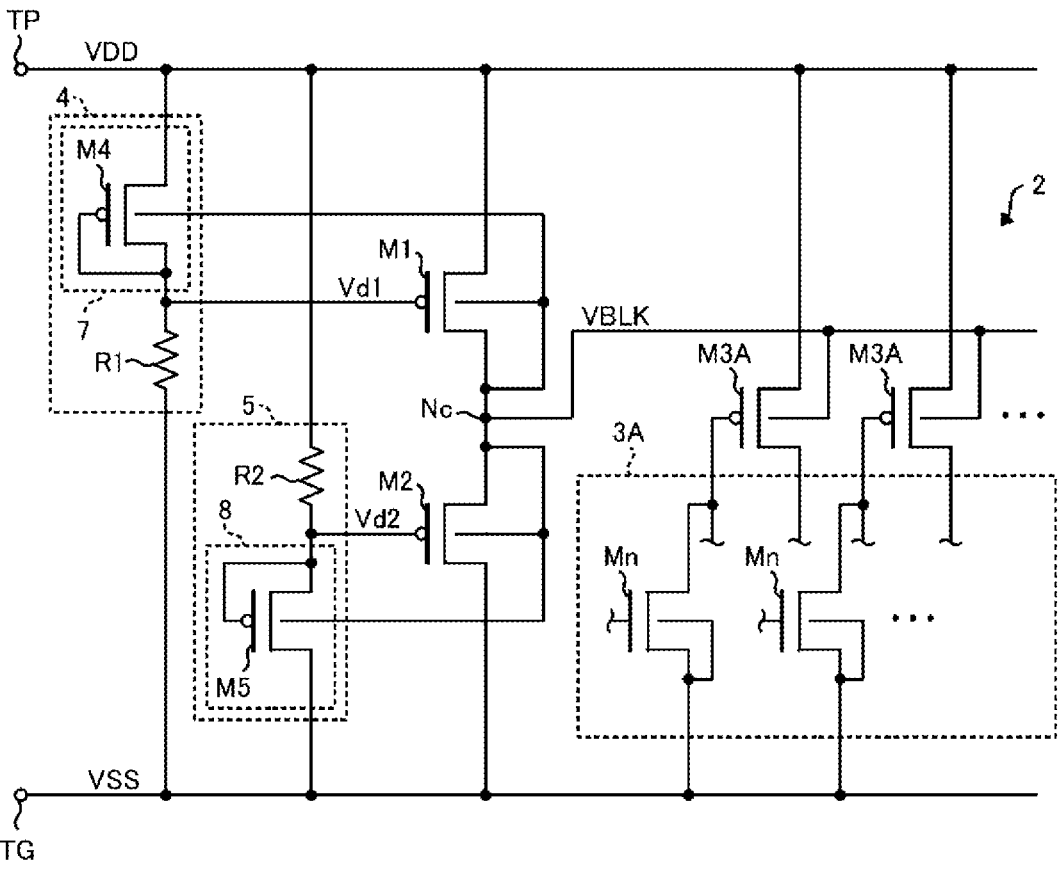
FIG. 6 is a diagram illustrating the semiconductor integrated circuit device according to a second embodiment.
Figure 7:
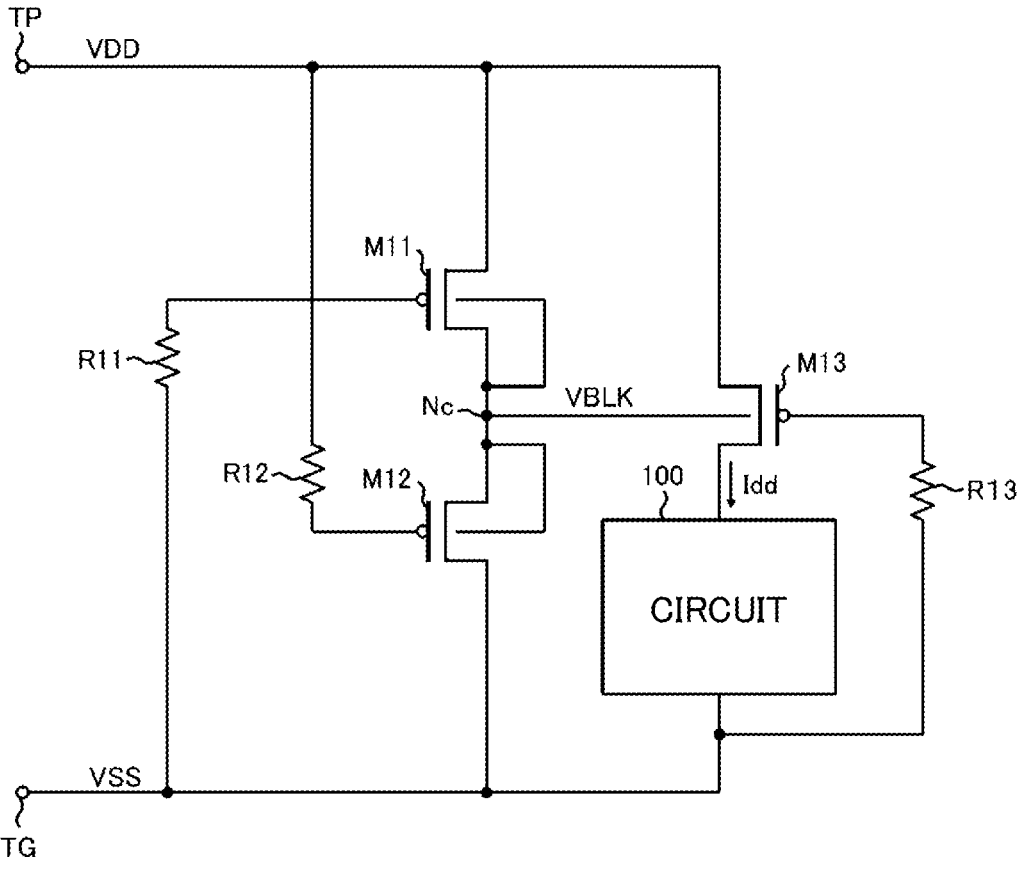
FIG. 7 is a diagram illustrating a protection circuit in related art.

FIG. 6 is a diagram illustrating a configuration example of a semiconductor integrated circuit device 1A according to the second embodiment. In the semiconductor integrated circuit device 1A according to the second embodiment, a plurality of third transistors M3A are used instead of the third transistor M3 in the semiconductor integrated circuit device 1 illustrated in FIG. 1, and a circuit 3A is used instead of the circuit 3. Other configurations are the same as those of the semiconductor integrated circuit device 1 illustrated in FIG. 1.

As illustrated in FIG. 6, the circuit 3A includes a plurality of transistors Mn that are n-type MOSFETs. The third transistors M3A are p-type MOSFETs, and are provided along respective paths between the supply terminal TP and the circuit 3A. At least a portion of the third transistors M3A may constitute a CMOS circuit in which one or more transistors Mn are coupled in series.

Each bulk of the third transistors M3A is in communication with the common node Nc. For example, the bulk of each third transistor M3A may be included in the n-type impurity diffusion region (the N well 11 and the N deep well 12), as in the bulks of the first transistor M1 to the fourth transistor M4.

As illustrated in FIG. 6, the bulk of each transistor Mn of the circuit 3A is in communication with the ground terminal TG. In addition, each transistor Mn is provided along a path between the gate of a corresponding third transistor M3A and the ground terminal TG.

The bulk of each transistor Mn is in communication with the ground terminal TG. In this case, if the voltage VSS at the ground terminal TG is higher than the voltage VDD at the supply terminal TP, a parasitic diode that is formed between the bulk (p-type impurity diffusion region) and a drain-source region (n-type impurity diffusion region) of each transistor Mn becomes conductive, and thus the voltage at the gate of the third transistor M3A becomes close to a magnitude of the voltage VSS at the ground terminal TG. With this arrangement, each third transistor M3A is turned off, and a path of the current that flows from each transistor Mn of the circuit 3A into the supply terminal TP via the third transistor M3A is interrupted. Therefore, an overcurrent can be prevented from flowing through the current path.

The present disclosure is not limited to the above embodiments, and various modifications and the like can be made.

The embodiments are described using an example in which one or more transistors constituting a protection circuit are MOSFETs. However, the one or more transistors may include any other type field effect transistors.

The above embodiments are described using an example in which elements constituting a protection circuit are included in the semiconductor integrated circuit device. However, in another embodiment, at least a portion of the elements constituting the protection circuit may include a discrete component that is not included in the semiconductor integrated circuit device.

According to one or more embodiments, a protection circuit and a semiconductor integrated circuit device including the protection circuit that is capable of reducing a gate withstanding voltage of a transistor can be provided.

What is claimed is:

1. A protection circuit for preventing an overcurrent caused by applying a supply voltage having a reverse polarity to a circuit to which power is supplied via a ground terminal and a supply terminal, the protection circuit comprising:
   a first transistor including a gate and a bulk, and being a p-type field effect transistor (FET), the first transistor being provided in a path between the supply terminal and a common node;
   a second transistor including a gate and a bulk, and being the p-type FET, the second transistor being provided in a path between the ground terminal and the common node;
   a third transistor including a bulk, and being the p-type FET, and the third transistor being provided in a path between the supply terminal and the circuit;
   a first gate drive configured to output a first drive voltage to the gate of the first transistor; and
   a second gate drive configured to output a second drive voltage to the gate of the second transistor,
   wherein the bulk of each of the first transistor, the second transistor, and the third transistor is in communication with the common node,
   wherein the first gate drive is configured to
      output the first drive voltage to turn the first transistor off, upon occurrence of a condition in which a voltage at the supply terminal is lower than a voltage at the ground terminal, and
      output the first drive voltage to turn the first transistor on, upon occurrence of a condition in which the voltage at the supply terminal is higher than the voltage at the ground terminal, the output first drive voltage being maintained higher than the voltage at the ground terminal, and
   wherein the second gate drive is configured to
      output the second drive voltage to turn the second transistor off, upon occurrence in a condition in which the voltage at the supply terminal is higher than the voltage at the ground terminal, and
      output the second drive voltage to turn the second transistor on, upon occurrence of a condition in which the voltage at the supply terminal is lower than the voltage at the ground terminal, the output second drive voltage being maintained higher than the voltage at the supply terminal.

2. The protection circuit according to claim 1, wherein the first gate drive includes
   a first rectifier provided in a path between the supply terminal and the gate of the first transistor, the first rectifier being configured to:
      become conductive, upon occurrence of a condition in which the voltage at the supply terminal is higher than a voltage at the gate of the first transistor, and
      be turned off, upon occurrence of a condition in which the voltage at the supply terminal is lower than the voltage at the gate of the first transistor, and
   a first resistor provided in a path between the gate of the first transistor and the ground terminal, and
   wherein the second gate drive includes
   a second rectifier provided in a path between the ground terminal and the gate of the second transistor, the second rectifier being configured to:
      become conductive, upon occurrence of a condition in which the voltage at the ground terminal is higher than the voltage at the gate of the second transistor, and
      be turned off, upon occurrence of a condition in which the voltage at the ground terminal is lower than the voltage at the gate of the second transistor, and
   a second resistor provided in a path between the gate of the second transistor and the supply terminal.

3. The protection circuit according to claim 2, wherein the first rectifier includes a fourth transistor provided in the path between the supply terminal and the gate of the first transistor, the fourth transistor being the p-type FET and including a gate electrically coupled to the gate of the first transistor, and
   wherein the second rectifier includes a fifth transistor provided in the path between the ground terminal and the gate of the second transistor, the second rectifier being the p-type FET and including a gate electrically coupled to the gate of the second transistor.

4. The protection circuit according to claim 3, wherein a bulk of each of the fourth transistor and the fifth transistor is in communication with the common node.

5. The protection circuit according to claim 4, wherein the bulk of each of the first transistor, the second transistor, the third transistor, the fourth transistor, and the fifth transistor is included in a common n-type impurity diffusion region.

6. The protection circuit according to claim 1, further comprising:
   a third gate drive configured to output a third drive voltage to the gate of the third transistor,
   wherein the third gate drive is configured to
      output the third drive voltage to turn the third transistor off, upon occurrence of a condition in which the voltage at the supply terminal is lower than the voltage at the ground terminal, and
      output the third drive voltage to turn the third transistor on, upon occurrence of a condition in which the voltage at the supply terminal is higher than the voltage at the ground terminal.

7. The protection circuit according to claim 6, wherein the third gate drive includes a third resistor provided in a path between the gate of the third transistor and the ground terminal.

8. The protection circuit according to claim 1, wherein the circuit includes an n-type FET including a bulk in communication with the ground terminal, and wherein the n-type FET is provided in a path between the gate of the third transistor and the ground terminal.

9. A semiconductor integrated circuit device comprising:

a circuit to which power is configured to be supplied via a ground terminal and a supply terminal; and the protection circuit of claim 1.

\*  \*  \*  \*  \*